(12) United States Patent
Bennett et al.

(10) Patent No.: US 6,348,820 B1
(45) Date of Patent: Feb. 19, 2002

(54) HIGH-SIDE, LOW-SIDE CONFIGURABLE DRIVER

(75) Inventors: Paul T. Bennett, Phoenix; Randall C. Gray, Tempe; Michael Garrett Neaves; Joseph V. DeNicholas, both of Phoenix, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/617,903

(22) Filed: Jul. 17, 2000

(51) Int. Cl.[7] .............................. H03B 1/00; H03K 3/00
(52) U.S. Cl. ...................... 327/110; 327/112; 327/310; 327/321; 327/388; 327/434; 327/566
(58) Field of Search ................................ 327/108, 110, 327/112, 309, 310, 321, 388, 427, 434, 566, 313, 318, 314, 324

(56) References Cited

U.S. PATENT DOCUMENTS

| | | | | |
|---|---|---|---|---|
| 4,858,055 A | * | 8/1989 | Okitaka | 327/313 |
| 5,347,169 A | * | 9/1994 | Prelar et al. | 327/110 |
| 5,414,314 A | * | 5/1995 | Thurber, Jr. | 327/427 |
| 5,434,739 A | | 7/1995 | Heck | 361/84 |
| 5,467,050 A | * | 11/1995 | Clapp, III et al. | 327/108 |
| 5,475,329 A | * | 12/1995 | Jones et al. | 327/110 |
| 5,757,213 A | * | 5/1998 | Moller | 327/108 |
| 5,793,245 A | * | 8/1998 | Marshall et al. | 327/321 |
| 5,828,247 A | * | 10/1998 | Moller et al. | 327/110 |
| 6,166,500 A | * | 12/2000 | Makaran | 318/254 |

\* cited by examiner

*Primary Examiner*—Terry D. Cunningham
*Assistant Examiner*—Long Nguyen

(57) ABSTRACT

A high-side, low-side driver that controls voltage from a voltage source to an inductive or resistive load includes a power transistor with a gate, a source and a drain. The driver is configured in a high-side configuration when the load is connected between the source and ground and the drain is connected to the voltage source and in a low-side configuration when the load is connected between the drain and the voltage source and the source is connected to ground. A gate drive circuit turns the power transistor on and off. The positive clamp circuit is connected to the drain and the voltage source. The positive clamp circuit provides a recirculation path for inductive energy that is stored in the inductive load when a loss of reverse battery condition occurs or when ground is lost. A negative clamp circuit that is connected to the source and ground provides a recirculation path for inductive energy that is stored in the inductive load when a loss of reverse battery condition occurs and when battery voltage is lost in the high-side configuration. The power transistor is preferably an isolated lateral double-diffused metal oxide semiconductor field effect transistor (ILDMOSFET). A current limit circuit includes lateral NPN transistors. Multiple drivers may be integrated into a single chip for controlling voltage to multiple inductive loads.

3 Claims, 14 Drawing Sheets

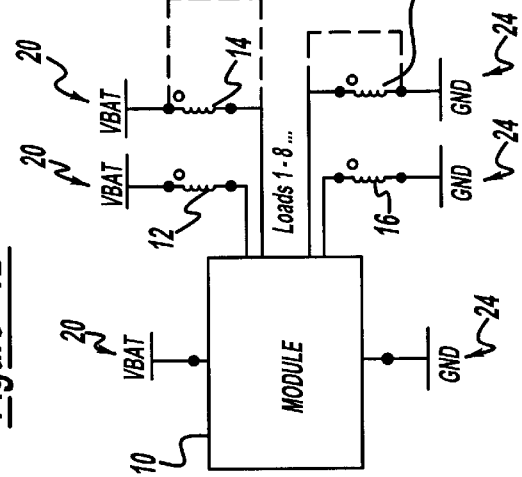
*Figure - 1B*
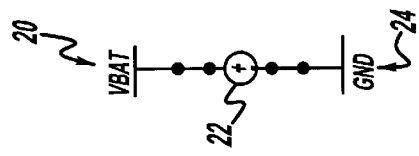
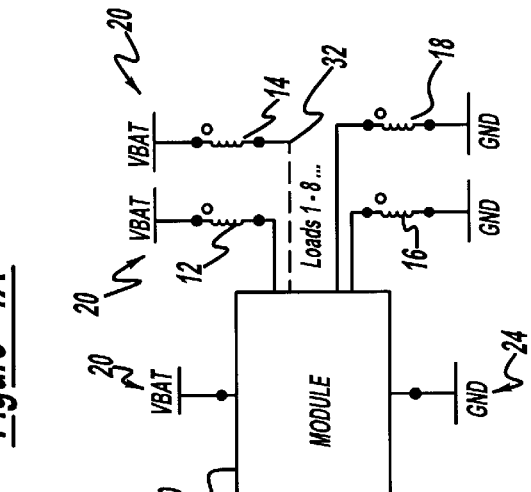
*Figure - 1D*
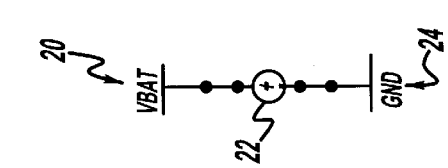
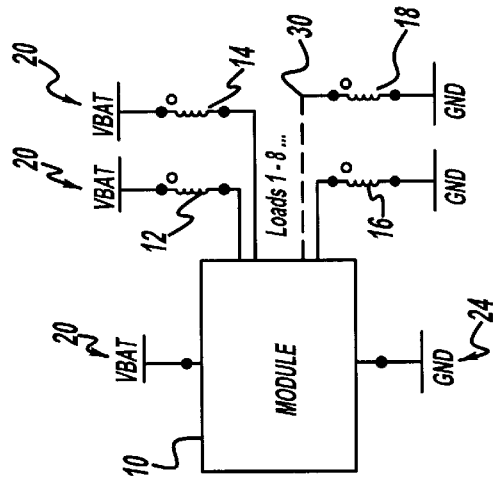
*Figure - 1A*
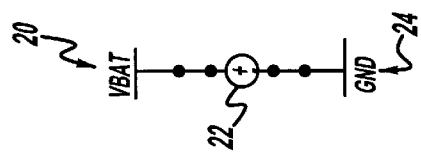
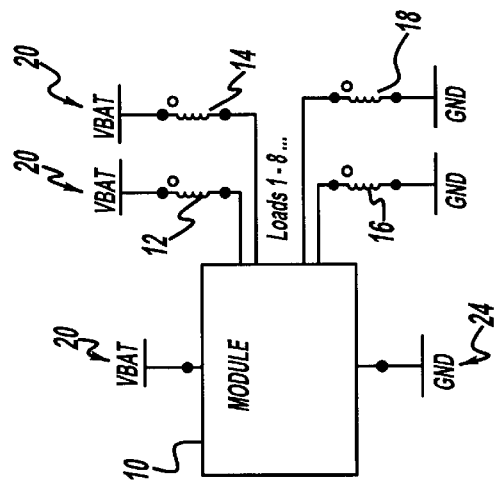
*Figure - 1C*
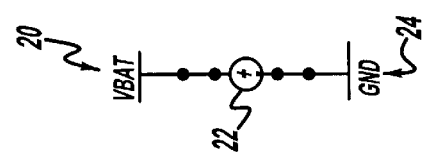

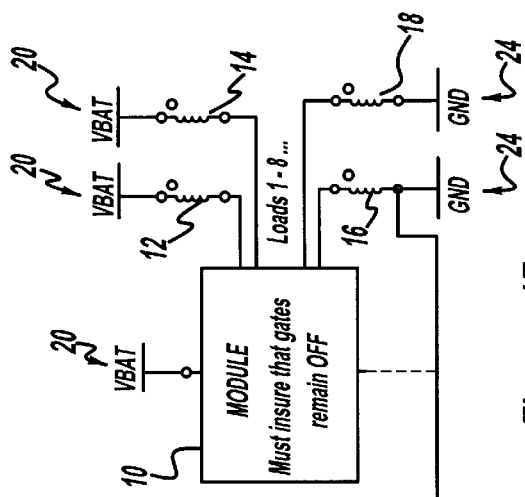
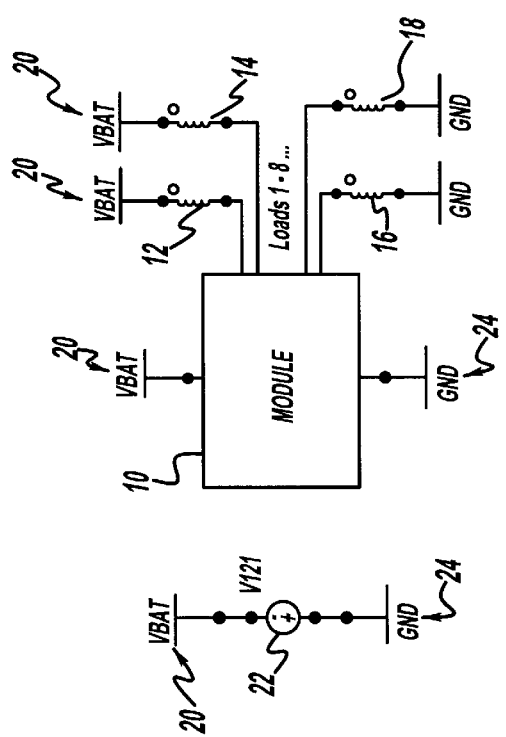
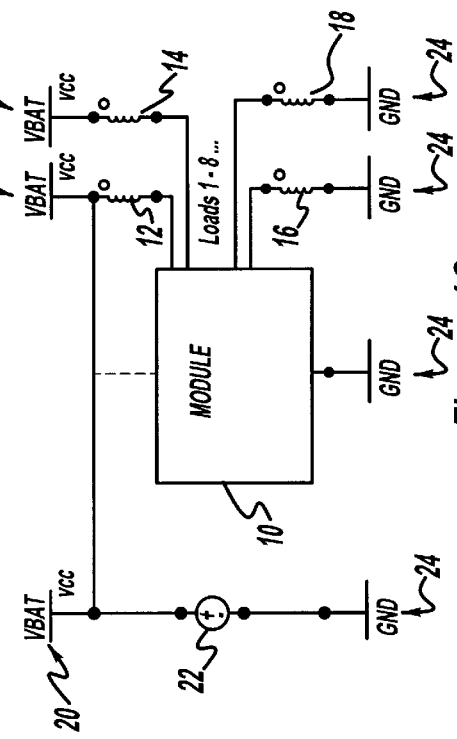

HIGH-SIDE, LOW-SIDE CONFIGURABLE DRIVER

BACKGROUND OF THE INVENTION

1. Field of the Invention

This invention relates to drivers that include power transistors. More particularly, this invention relates to a high-side, low-side configurable driver for inductive and/or resistive loads that is capable of handling fault conditions and dissipating inductive energy during the fault conditions.

2. Background Information

Automotive applications typically require the switching of loads such as lamps and/or inductive solenoids. The loads are generally connected to a driver or switch in either a high-side or a low-side configuration. In the high-side configuration, the load is connected between the driver and ground. In the low-side configuration, the load is connected between a voltage source and the driver.

Multiple driver circuits are often combined into an integrated circuit module. The module, in turn, is connected to the battery of the vehicle and ground. A microprocessor is typically associated with the driver and is connected locally. The loads are generally connected remotely.

The module detects and reports open and shorted loads, provides thermal protection, survives loss of module ground, and survives reverse battery faults. The module must also protect against supply interruption during energized inductive loads and comply with other transient tests. While many conventional modules are capable of providing these features, the modules typically require the addition of external components which diminish the reliability of the electronic system, add to the overall cost, and increase the overall size of system Conventional modules that address the reverse battery and partial loss of ground issues employ either blocking field effect transistors (FETs), blocking diodes, or isolated substrates. These solutions are complex, costly to manufacture, tend to reduce the overall system reliability, and/or degrade the performance of the module. By placing a diode in series with the drain of the FET, the device is protected from the reverse battery fault condition. The voltage drop across the diode, however, degrades system performance. In addition, the diode cannot be realized in an integrated circuit in a standard plastic package due to thermal dissipation and size issues. Therefore, discrete elements must be added to the integrated circuit.

The power transistor may also be protected by a second power transistor which is coupled upside-down and enhanced during normal operation with a charge pump. This technique is disclosed in U.S. Pat. No. 5,434,739, which is hereby incorporated by reference. None of these conventional solutions address the loss of ground.

BRIEF DESCRIPTION OF THE DRAWINGS

FIGS. 1A–1G illustrate various fault conditions that should be addressed in a high-side, low-side driver module;

DETAILED DESCRIPTION OF THE PREFERRED EMBODIMENT

Figure 2:
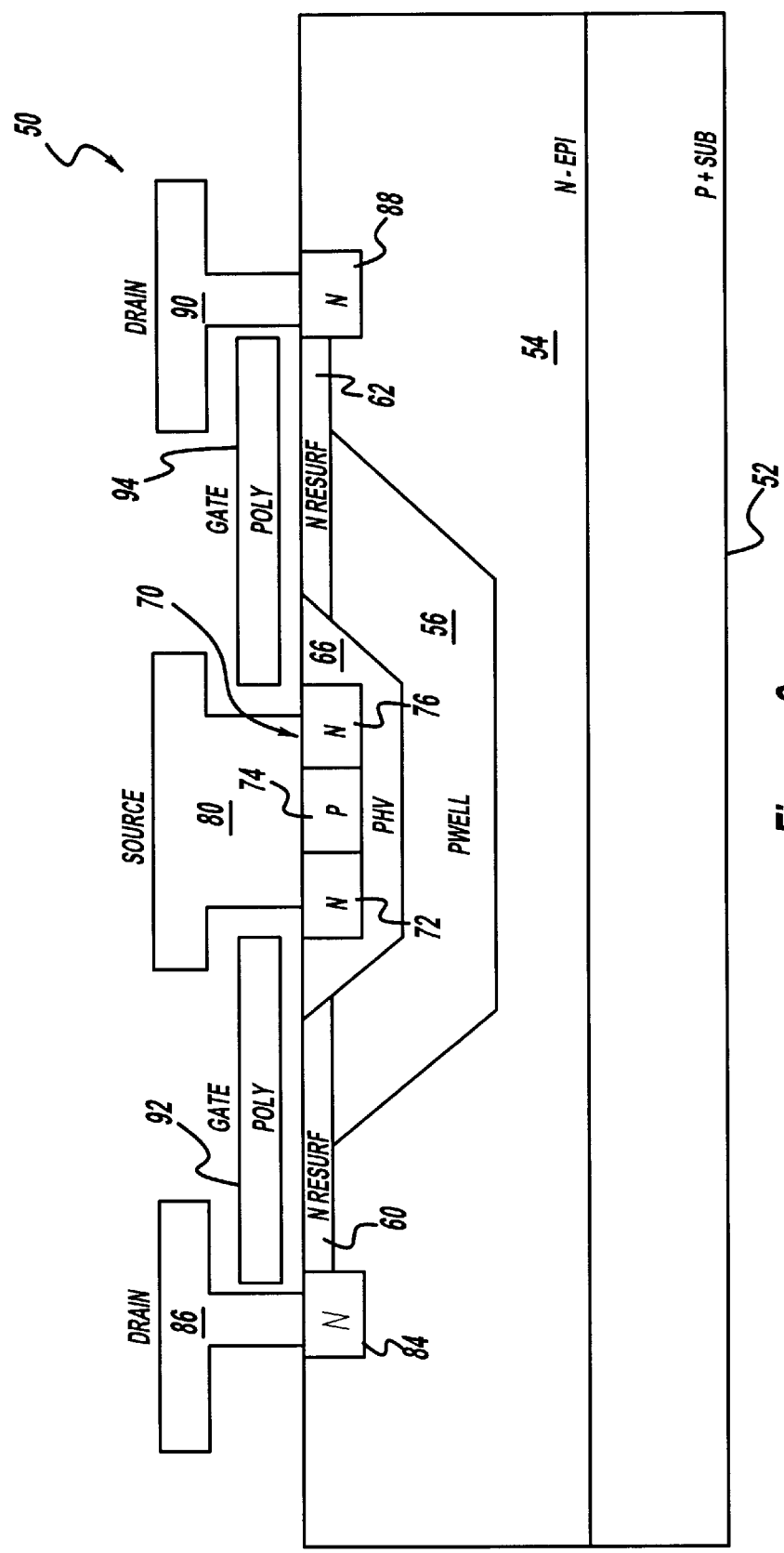
FIG. 2 illustrates a cross-section of a lateral DMOS power transistor.

Referring to FIG. 1A, a module 10 is illustrated and includes a plurality of configurable high-side, low-side drivers or switches. The module 10 is connected to a plurality of inductive loads 12, 14, 16, and 18. The module is also connected to VBAT 20 provided by a battery 22 and a system ground 24. The loads 12 and 14 are in a low-side configuration. The loads 16 and 18 are in a high-side configuration.

For a low-side driver, the gate drive circuitry provides an efficient and well-defined turn-on characteristic for the power transistor when current-mode driven. The gate current, when held constant, holds the turn-on and turn-off time of the power transistor constant. This feature reduces the electromagnetic interference to other electronic assemblies within the automobile.

When the power transistor is off in either the high-side or low-side configuration, the drain-to-source voltage should be greater than 3 volts. An open load may be detected whenever the voltage between the drain and source is low and the device is off. This situation should occur for both an open high-side load illustrated in FIG. 1B and an open low-side load illustrated in FIG. 1C. In FIG. 1B, an intermittent or broken connection 30 between the load 18 and the module 10 occurs. In FIG. 1C, an intermittent or broken connection 32 between the load 14 and the module 10 occurs.

When the power transistor is on, the drain-to-source voltage of the power transistor should be much less than 3 volts. If a load 14 or 18 is shorted, as illustrated in FIG. 1D, then the drain-to-source voltage will stay high After 100 to 300 microseconds, a fault detector that senses this condition will report a fault. A microprocessor (not shown) allows the drivers to remain on for a brief period after detecting a fault. Because lamps generally take 2 to 100 milliseconds to heat-up and change resistance, the microprocessor allows the lamp to run in a short circuit limit mode during an initial current surge.

Thermal faults are detected by the fault detector whenever the temperature near the power transistor exceeds 150° C. When this condition occurs, the power transistor is turned off and a thermal fault is latched into the fault register associated with the fault detector. The microprocessor generally allows a small delay of 1 or 2 microseconds to be employed to filter noise and other system errors which otherwise may falsely report the thermal fault.

Referring now to FIG. 2, a lateral double-diffused metal oxide semiconductor field effect transistor (ILDMOSFET) 50 has typically been used for the power transistor. The LDMOSFET 50 includes a P-type substrate 52. An N-type epitaxial (N-EPI) layer 54 is grown on the P-type substrate 52. A P-type well (PWELL) 56 is implanted on the N-EPI layer 54. N-type resurfacing (N RESURF) layers 60 and 62 are implanted in the PWELL layer 56 and the N-EPI layer 54. A P-type high voltage (PHV) layer 66 is implanted in the PWELL layer 56 and the NRESURF layers 60 and 62.

A junction 70 (containing an N-type (N) layer 72 that is adjacent a P-type (P) layer 74 and another N-type (N) layer 76) is implanted in the PHV layer 66. A source lead 80 is connected to the junction 70. An N-type (N) layer 84 is implanted in the N-EPI layer 54 and is connected to a drain lead 86. Similarly, an N-type (N) layer 88 is formed in the N-EPI layer 54 and is connected to a drain lead 90. The power transistor 50 also includes first and second gate leads 92 and 94 which are preferably formed from polysilicon.

The N-EPI layer 54 must always be kept at a potential that is greater than the P-type substrate 52 to keep substrate current from flowing and the N-EPI "islands" electrically isolated. If the N-EPI layer 54 is not kept reverse biased relative to the P-type substrate 52, a significant amount of current will flow and damage the power transistor 50.

When the battery is improperly installed using the wrong polarity, the devices connected directly to the battery terminal must be protected from the reverse battery fault condition (see FIG. 1E, where battery 22 is depicted with reversed polarity). If the N-EPI layer 54 is tied directly to the battery with the wrong polarity and the P-type substrate layer 52 is tied to ground, then the module 10 will be destroyed by the excessive and unlimited current flow across a junction between the N-EPI layer 54 and the P-type substrate 52.

In the high-side configuration, the drain lead 86 or 90 of the power transistor 50 is directly connected to the VBAT terminal. The power transistor 50 is not suitable for use with a high-side, low-side driver module unless a blocking FET or a diode protects the junction during the reverse battery condition. During the reverse battery condition, it is permissible to allow current to flow through the inductive loads in a reverse direction. The power transistor also has a back-body diode inherent to the device between the source lead 80 and the drain lead 86 or 90. The back-body diode becomes forward biased whenever the voltage at the source lead 80 is higher than at the drain lead 86 or 90. During the reverse battery condition, current will flow through the inductive loads.

When the ground to the module 10 is intermittent or absent as is illustrated in FIG. 1F, a battery connection and the connections to other modules and loads remain intact. During this condition, the input and output pins that connect to devices that are external to the module 10 may see voltages that are reversed relative to the substrate layer 52 and that are similar in magnitude to the reverse battery condition. This is caused by the fact that the ground and the substrate of the module 10 are pulled up to the battery potential during loss of module ground.

External pins that are still connected to ground appear to be held below ground relative to the module 10 since the module 10 is now referenced to VBAT and not true ground. If external pins cannot go below ground relative to the substrate without sourcing current, the ground of the module 10 will be pulled down through these external pins and erratic operation of the module 10 may occur. Note components local to the module 10 do not see negative voltages unless connected to external modules or loads. However, the battery voltage may be abnormally low due to leakage from sourcing current through the external connections. These leakage paths should be eliminated or reduced during the loss of ground condition.

The gate of the power transistor 50 must also be allowed to go below ground during the loss of ground condition If the gate is clamped to a diode below ground, then the power transistor will turn on during loss of ground when in the high-side configuration. If the substrate and ground connections of the integrated circuit are pulled to battery with the load connected to ground, then the gate must be able to go to ground to keep the power transistor 50 off even when the substrate of the chip is held to the battery voltage. During the loss of ground and loss of battery conditions, the power transistor 50 is held off by passive pull-down.

Finally, the module 10 must be able to dissipate energy stored in the inductive loads during loss of ground, loss of battery and loss of reverse battery. When the ground connection is lost to the module and current is flowing in an inductive low-side configuration load, current flow through the power device is interrupted. The voltage across the inductor changes value and the current decays. The energy stored in the coil is proportional to the inductance and the square of the current In a low-side configuration, when the connection to ground is lost, the current can no longer return to ground through the power transistor 50. Instead, current must be returned directly back to the battery which is the only remaining path. Conversely, when the battery connection is lost and current is flowing in an inductive high-side load, the current flow through the power device is interrupted and current must be returned to ground instead of through the battery.

Figure 3:
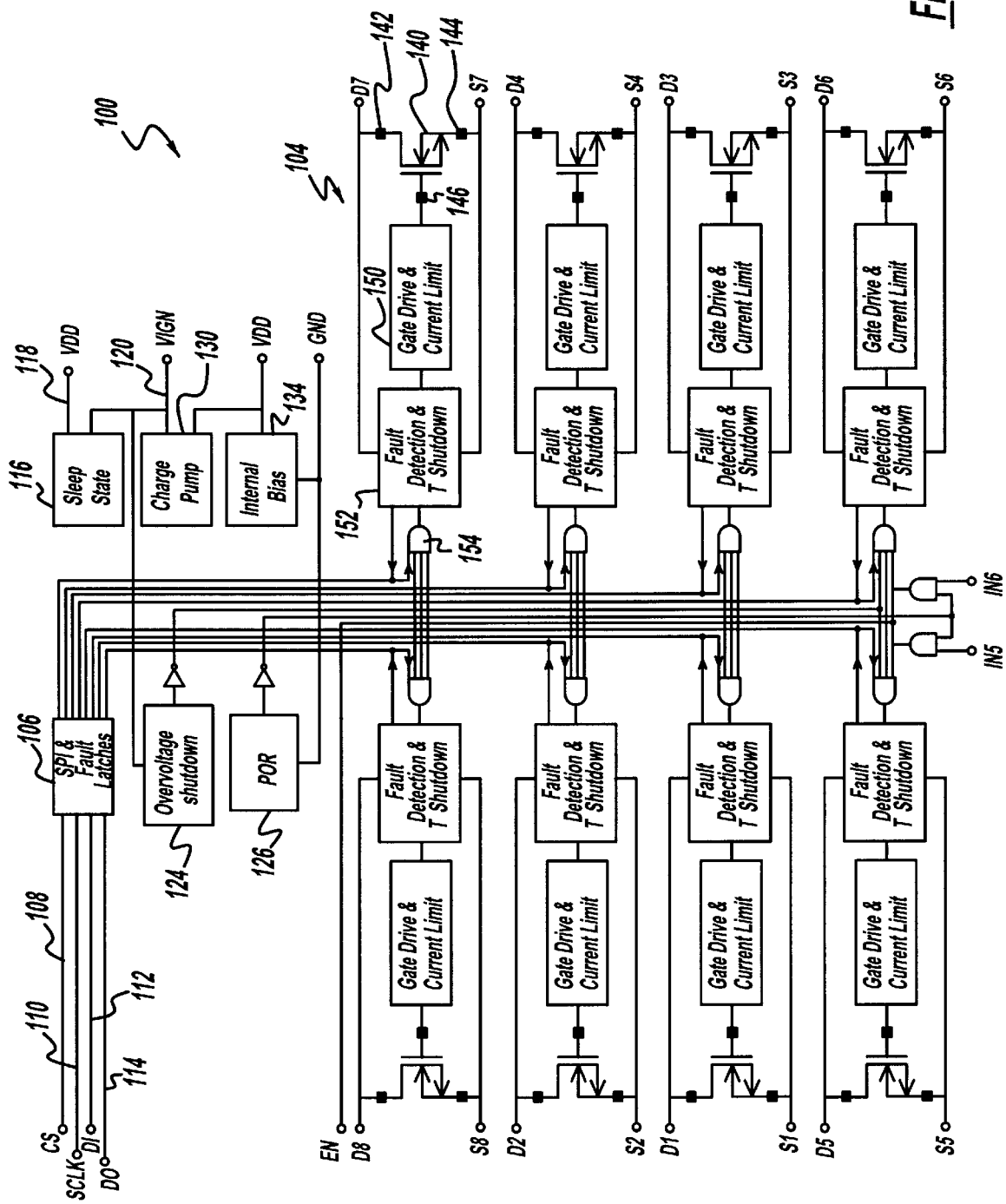
FIG. 3 is a functional block diagram of a high-side, low-side driver module according to the invention.
Figure 4:
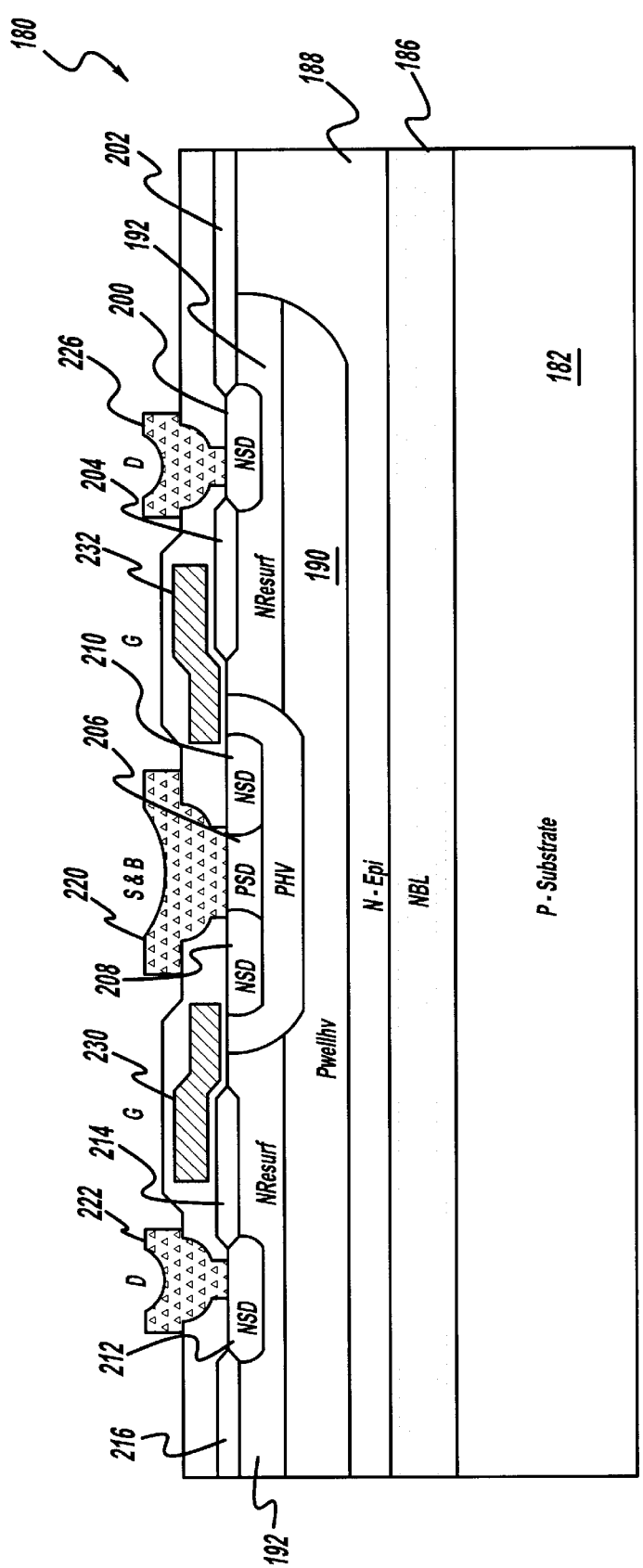
FIG. 4 is a cross-section of an isolated lateral DMOS power transistor according to the present invention.

Referring now to FIG. 3, an integrated circuit (IC) 100 that contains multiple high-side, low-side drivers 104 is illustrated. A microprocessor (not shown) is connected to a serial peripheral interface (SPI) and fault latches circuit 106. The SPI and fault latches circuit 106 includes a chip select (CS) input 108 which allows the microprocessor to enable or select the IC 100. A clock input (SCLK) 110 toggles flip-flops in the IC 100. Data input (DI) 112 and data output (DO) 114 are likewise input to the SPI and fault latches circuit 106. A sleep state circuit 116 is connected to a 5 volt (V) supply voltage VDD 118 and VIGN 120. VDD 118 is provided when the automobile is on. VIGN 120 provides battery power.

An overvoltage shut-down circuit 124 turns off the IC 100 when VIGN 120 exceeds a threshold voltage (preferably greater than 22 V). A power-on reset circuit 126 ensures that initial states of devices in the IC 100 are correct and known. A charge pump circuit 130 and an internal bias circuit 134 operate in a conventional maimer.

Each driver contains a power transistor 140 which has a drain input 142, a source input 144, and a gate input 146. A gate drive and current limit circuit 150 turns the gate 146 of the power transistor 140 on and off. A fault detection and thermal shutdown circuit 152 identifies one or more fault conditions. A thermal shut-down portion of the fault detection and thermal shut-down circuit 152 shuts down the power transistor 140 if the temperature of the power transistor 140 exceeds a thermal limit (typically greater than 150° Celsius). A quad input AND circuit 154 enables the gate drive and current limit circuit 150 if each input is high Preferably, the power transistor 140 is implemented using an isolated lateral double-diffused metal oxide semiconductor field effect transistor (ILDMOSFET). Referring to FIG.

4, a cross-section of an ILDMOSFET transistor 180 is illustrated and includes a P-type substrate (P-substrate) layer 182. An N-type buried layer (NBL) 186 is implanted in the P-substrate layer 182. An N-EPI layer 188 is grown on the NBL 186. A P-type well high-voltage (PWELL HV) layer 190 is implanted on the N-EPI layer 188. An NRESURF layer 192 is implanted on the PWELL HV layer 190.

A P-type high voltage (PHV) layer 194 is grown and etched on the N-RESURF layer 192 and the P-type well high voltage layer 190. An N-type source/drain diffusion (NSD) layer 200 is grown and etched on the N-RESURF layer 192. A field oxide insulating layer 202 is grown and etched on the layers 188, 190, 192, and 200. A field oxide insulating layer 204 is also grown and etched on the layers 192 and 200. A P-type source diffusion (PSD) layer 206 and NSD layers 208 and 210 are implanted in the PHV layer 194. An NSD layer 212 is implanted in the NRESURF layer 192. A field oxide insulating layer 214 is grown and etched on the layers 192 and 212. A field oxide insulating layer 216 is grown and etched on the layers 192 and 212.

The source lead 220 of the power transistor 180 is in contact with the NSD layers 208 and 210 and the PSD layer 206. A drain lead 222 is connected to the NSD layer 212. A second drain lead 226 is connected to the NSD layer 200. The power transistor 180 further includes first and second gate leads 230 and 232, in polysilicon.

Figure 5:
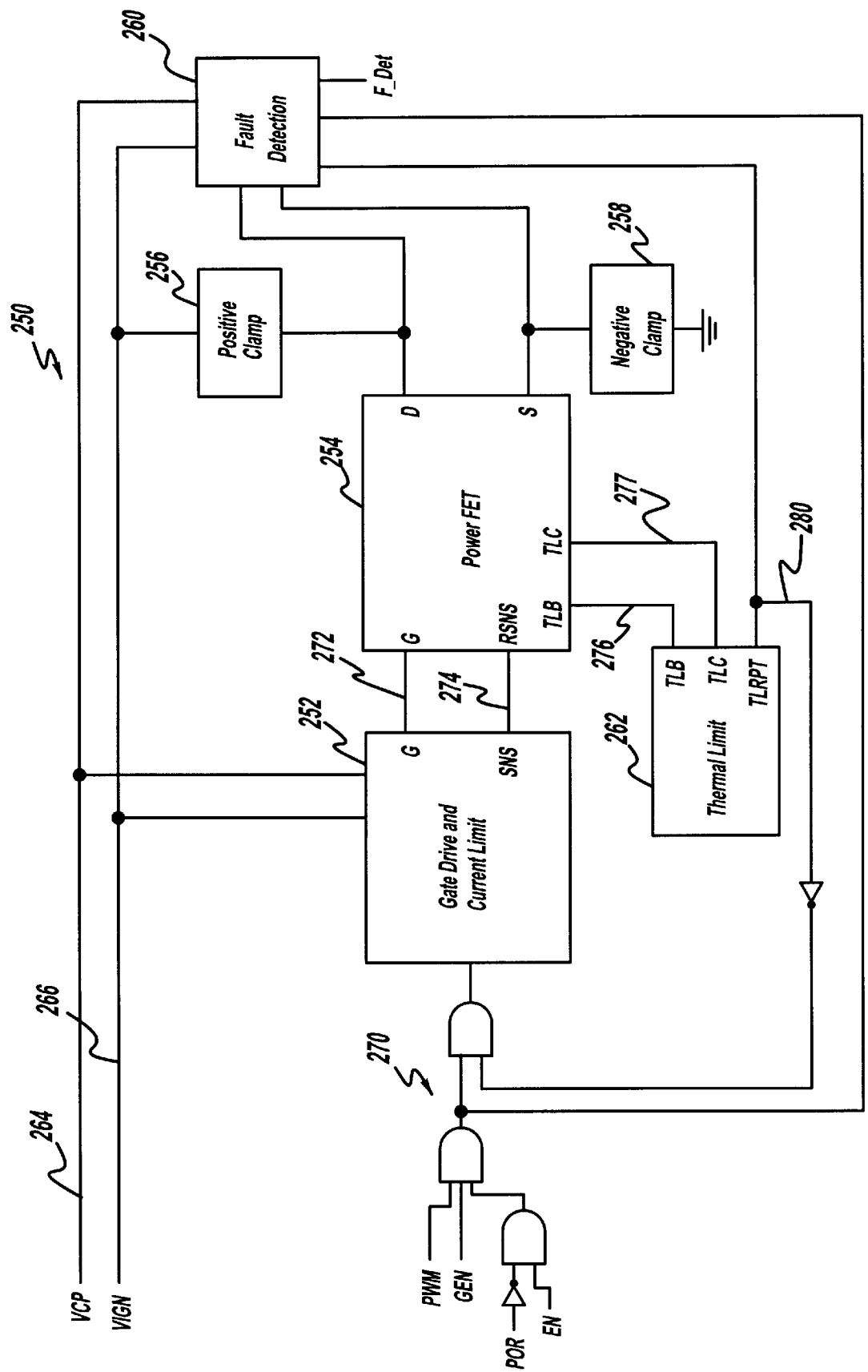
FIG. 5 is a functional block diagram illustrating a gate drive and current limit circuit, a power FET circuit, a thermal limit detection circuit, positive and negative clamps, and a fault detection circuit according to the invention.

Referring now to FIG. 5, a high-side, low-side driver 250 is illustrated in further detail. The driver 250 includes a gate drive and current limit circuit 252, a power FET circuit 254, a positive clamp circuit 256, a negative clamp circuit 258, a fault detection circuit 260, and a thermal limit circuit 262.

The gate drive and current limit circuit 252 is connected to a charge pump voltage 264, battery voltage 266, and an enabling circuit 270. The gate drive and current limit circuit 252 generates a gate drive output 272 which is input to the power FET circuit 254. The gate drive and current limit circuit 252 receives a current sensing input 274 from the power FET circuit 254 as will be described further below.

The thermal limit circuit 262 includes a sensor that is located in proximity to a power transistor (FIG. 7) forming part of the power FET circuit 254. The thermal limit circuit senses current flowing on input lines 276 and 277 (that is proportional to the temperature of the power transistor) and generates a thermal fault signal on an output 280 to the fault detection circuit 260 and the enabling circuit 270.

The positive clamp circuit 256 is connected between battery voltage 266 and the drain lead of the main power transistor. The positive clamp circuit 256 provides a recirculation path for inductive energy stored in the inductive load when the driver 250 is in the low-side configuration and the module 10 loses ground or the power supply is connected with a reverse polarity and the battery is disconnected.

The negative clamp circuit 258 is connected to the source lead of the power transistor associated with the power FET circuit 254 and to ground. The negative clamp circuit provides a recirculation path for inductive energy stored in the inductive load when the voltage source connected to the module is lost or when the battery is connected with a reverse polarity (reverse battery) and the battery is lost.

Figure 6A:
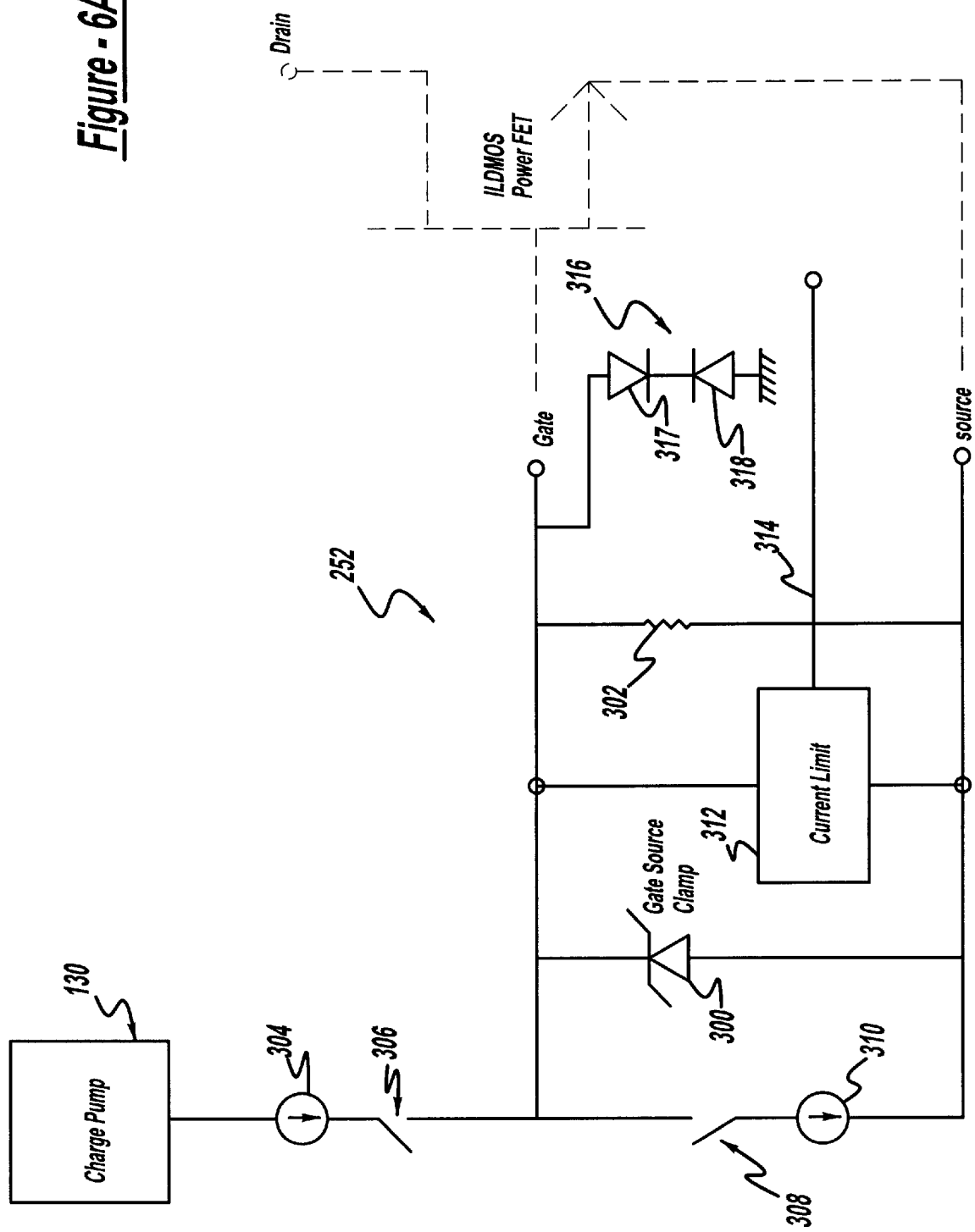
FIG. 6A illustrates a simplified gate drive circuit according to the present invention.

Referring now to FIG. 6A, the gate drive and current limit circuit 252 of FIG. 5 is illustrated in further detail. The gate drive and current limit circuit 252 includes a gate-source zener diode clamp 300 having an anode connected to the source of the main power transistor and a cathode connected to the gate of the power transistor. A passive pull-down resistor 302 is connected between the gate and the source of the power transistor. An ideal current source 304 is connected to charge pump voltage generated by the charge pump circuit 130 and to a switch 306. A second switch 308 is connected to a second ideal current source 310 which is connected to the source of the power transistor. A current limit circuit 312 is connected to the gate and the source of the power transistor and to a resistive sensing input 314. A negative clamp 316 includes first and second diodes 317 and 318. The first diode 317 has an anode that is connected to the gate of the power transistor. The second diode has a cathode that is connected to a cathode of the first diode 317. The negative clamp 316 clamps the gate below ground during normal operation. The negative clamp 318 preferably drives the gate approximately 18 volts below ground. The source must be driven to −20V to turn the power transistor on.

Figure 6B:
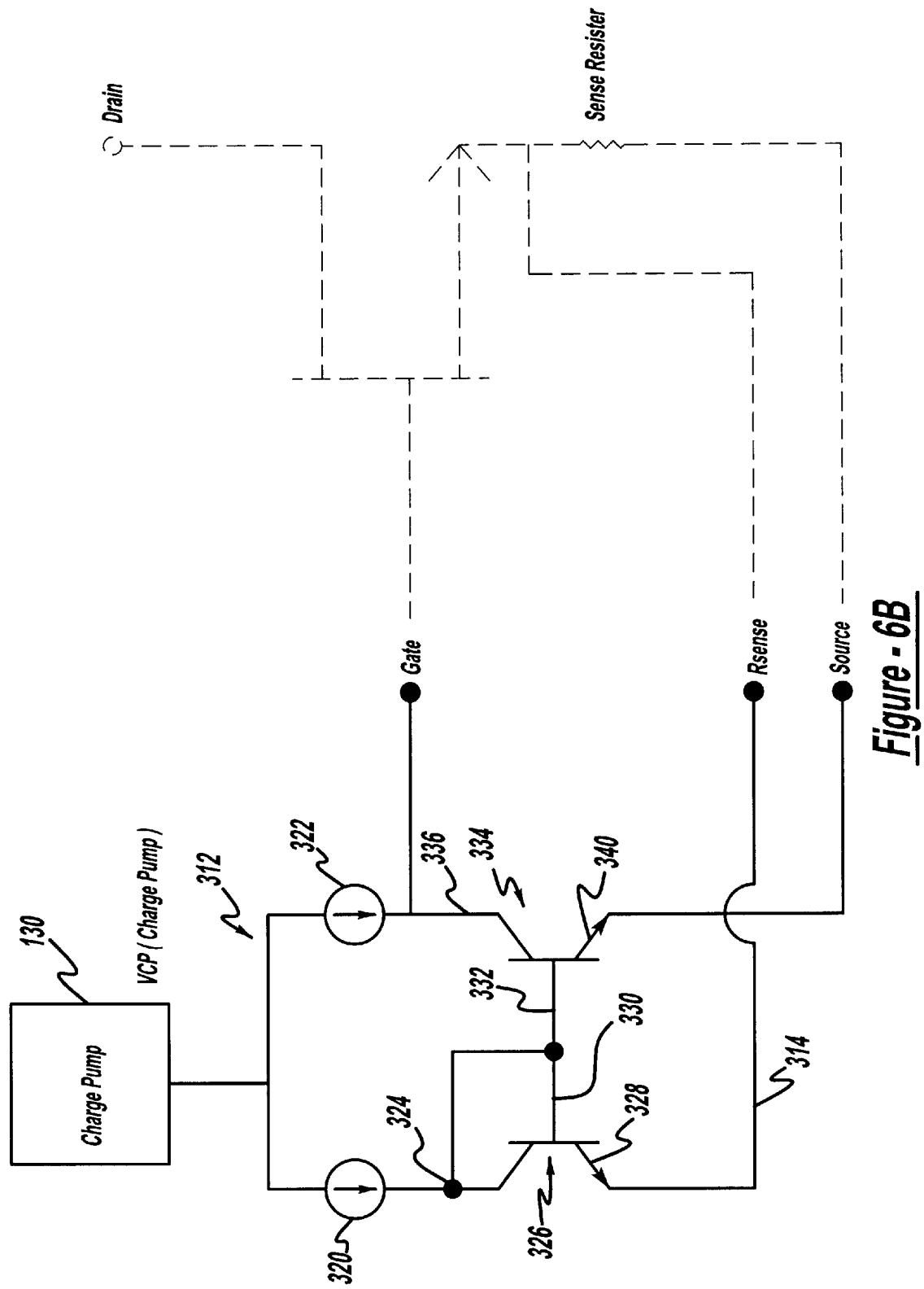
FIG. 6B illustrates a simplified current limiter according to the present invention.

Referring now to FIG. 6B, the current limit circuit 312 is illustrated in further detail and includes first and second current sources 320 and 322 that are connected to the charge pump circuit 130. The current source 320 is connected to a collector 324 of a first lateral NPN transistor 326. An emitter 328 of the transistor 326 is connected to the resistive sensing input 314. The collector of the transistor 326 is connected to a base 330 of the transistor 326 and to a base 332 of a second lateral NPN transistor 334. The second ideal current source 322 is connected to the gate of the power transistor and to a collector 336 of the transistor 334. An emitter 340 of the transistor 334 is connected to the source of the power transistor. The current limiter generally operates in a conventional manner (other than the use of lateral NPN transistors).

Figure 6C:
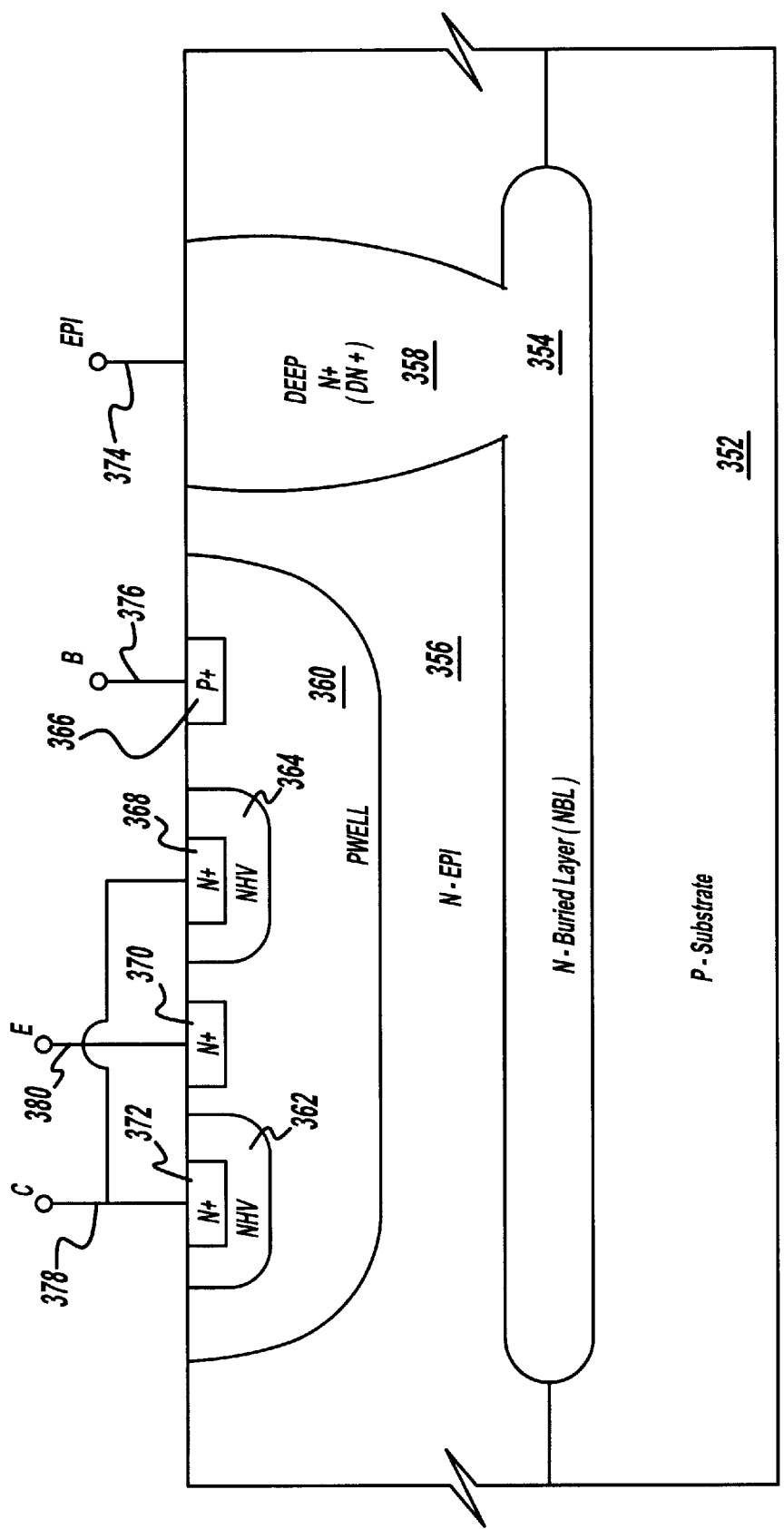
FIG. 6C illustrates a cross-sectional view of a lateral NPN transistor.

Referring now to FIG. 6C, the lateral NPN transistors 326 and 334 are illustrated in further detail. The lateral NPN transistor 326 includes a P-substrate 352. An NBL 354 is implanted in the P-substrate layer 352. An N-EPI layer 356 is grown on the NBL 354. A deep N+layer (DN+) 358 is implanted in the NBL 354 and N-EPI layer 356. A P-WELL layer 360 is implanted in the N-EPI 356. An N-type high voltage (NHV) layer 362 is implanted in the P-WELL layer 360. A second NHV layer 364 is implanted in the PWELL layer 360. A P+layer 366 is implanted in the PWELL layer 360. An N+layer 368 is implanted in the NHV layer 364. An N+layer 370 is implanted in the PWELL layer 360. An N+layer 372 is implanted in the NHV layer 362. An epitaxial lead 374 is attached to the deep N+layer 358. A base lead 376 is connected to the P+layer 366. A collector lead 378 is connected to the N+layers 368 and 372. An emitter lead 380 is connected to the N+layer 370.

Figure 7:
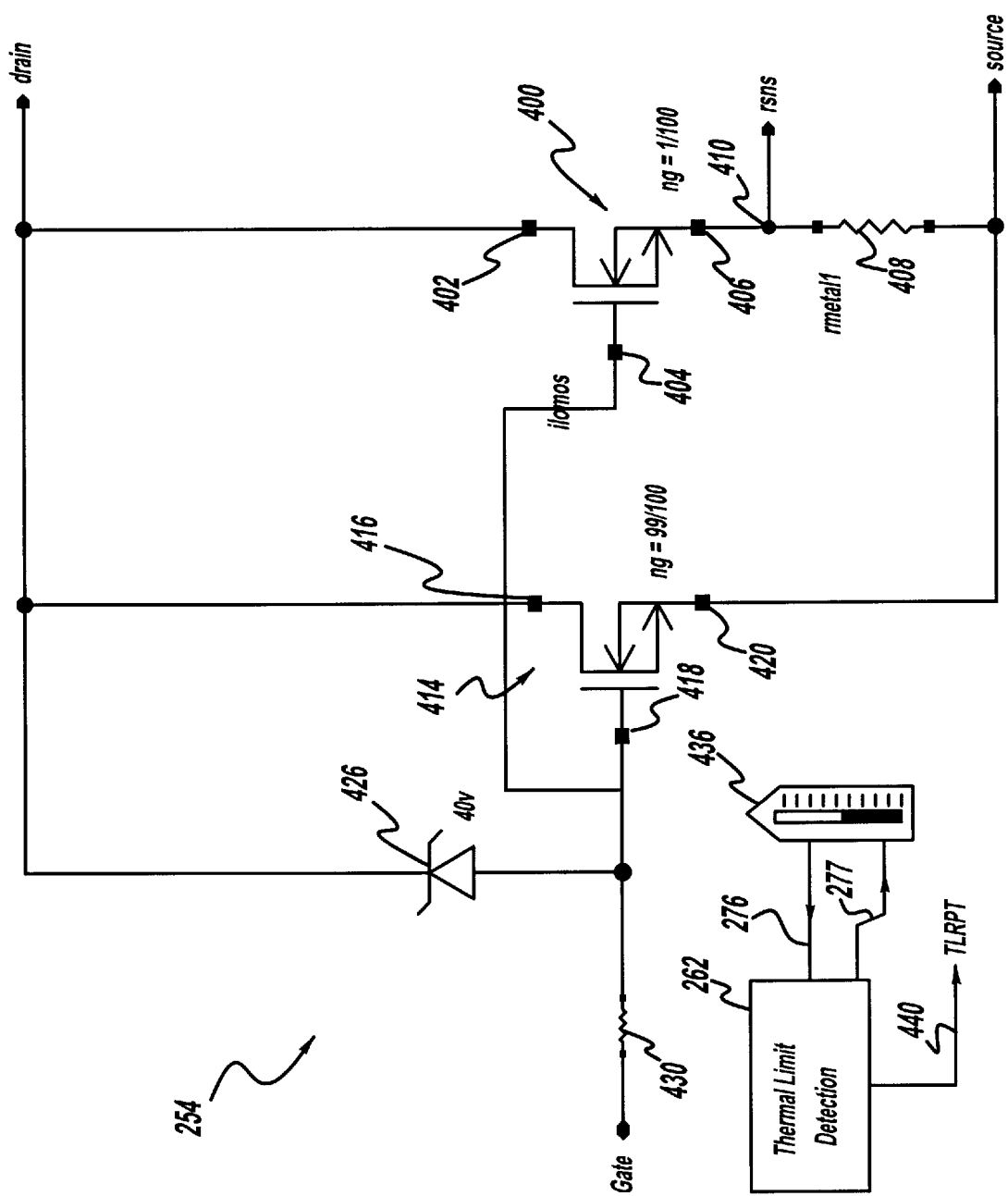
FIG. 7 illustrates the power FET circuit of FIG. 5 in further detail.

Referring now to FIG. 7, the power FET circuit 254 is illustrated and includes a sensing power transistor 400 which includes a drain 402, a gate 404, and a source 406. A sensing resistor 408 has a first end connected to the source 406. The current sensing output is connected at a node 410. The sensing power transistor 400 includes one of one-hundred gates. The main power transistor 414 includes a drain 416, a gate 418, and a source 420. The main power transistor 414 includes ninety-nine of one-hundred gates. The gate 404 of the sensing power transistor 400 is connected to the gate 418 of the main power transistor 414. A 40 V zener diode 426 has an anode which is connected to the gate 418 of the main power transistor 414 and a cathode which is connected to the drains 402 and 416 of the transistors 400 and 414, respectively. Preferably, the power transistors 400 and 414 are ILDMOSFET transistors.

The conventional thermal limit detection circuit 262 senses current generated by a thermal limit sensor 436 which is located in proximity to the power transistor 414. When a thermal threshold is exceeded, the thermal limit detection circuit 262 generates a thermal limit report signal 440 (identified at 280 in FIG. 5) to the fault detection circuit 260 and to the enabling circuit 270.

The diode 426 operates as a primary positive clamp for recirculating energy in the low-side configuration during normal operation. Likewise, the negative clamp 316 acts as a primary negative clamp that recirculates energy in the high-side configuration during normal operation.

Figure 8A:
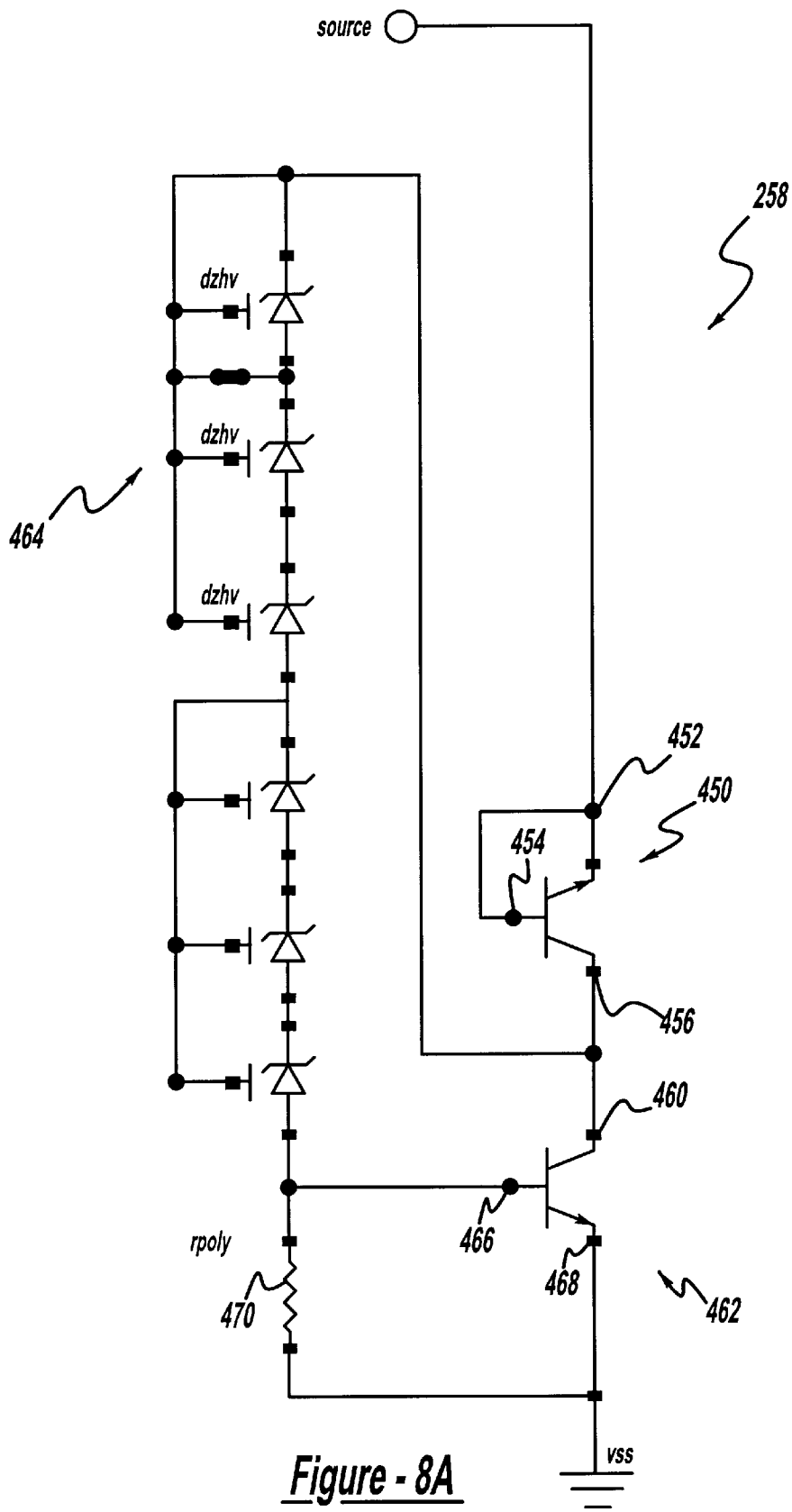
FIG. 8A illustrates the negative clamp circuit of FIG. 5 in fatter detail.

Referring now to FIG. 8A, the negative clamp circuit 258 is illustrated in furthers detail and includes an NPN transistor 450 which has an emitter 452 and a base 454 that are connected to the source of the main power transistor. The negative clamp circuit 258 operates as a secondary negative clamp in fault modes of operation. A collector 456 of the transistor 450 is connected to a collector 460 of an NPN transistor 462 and to one end of a plurality of series-connected zener diodes 464. An opposite end of the zener diodes 464 is connected to a base 466 of the transistor 462. An emitter 468 of the transistor 462 is connected to ground. A resistor 470 has one end connected to the series-connected zener diodes 464 and to the base 466 of the transistor 462 and an opposite end connected to ground.

Figure 8B:
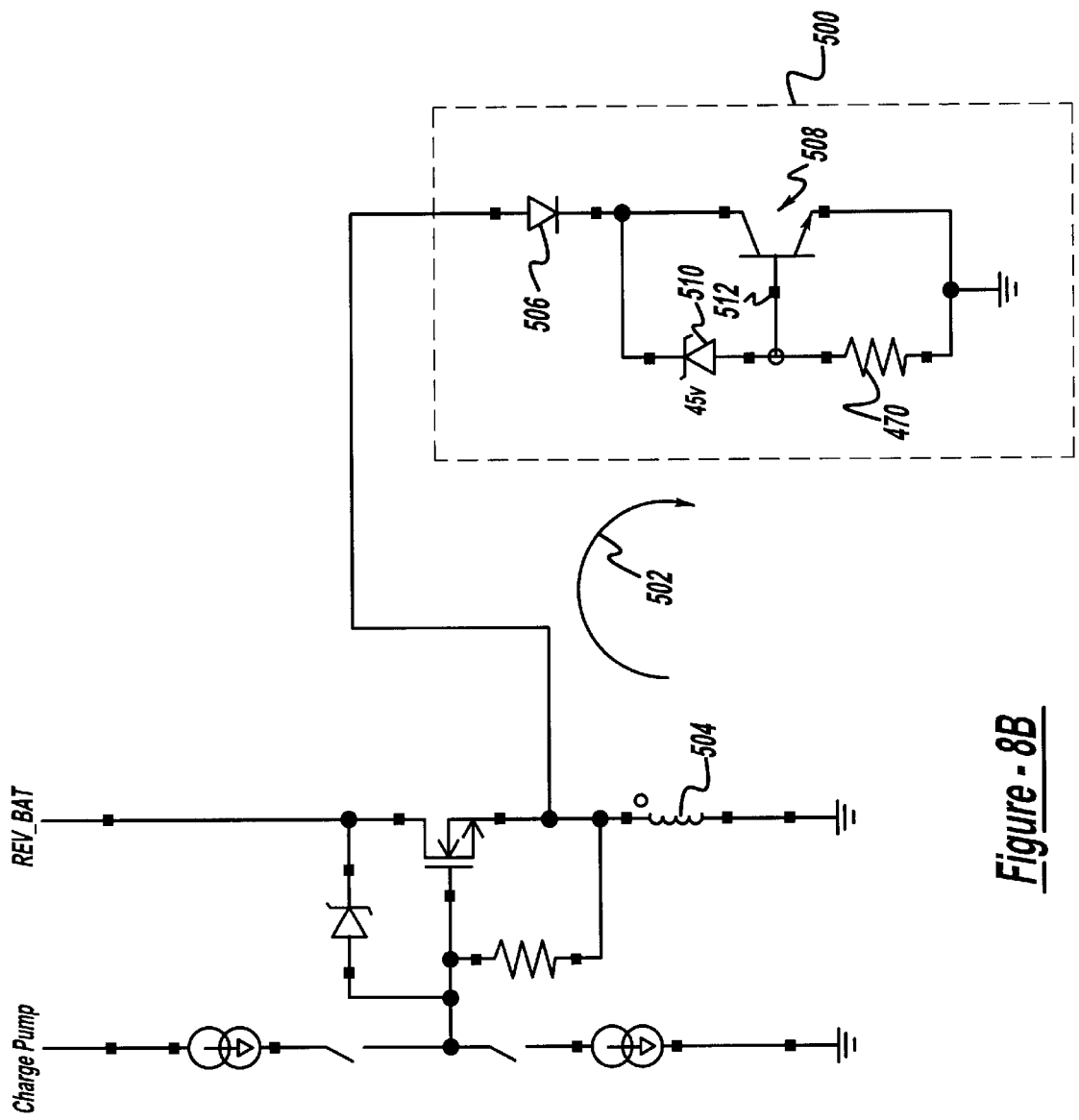
FIG. 8B illustrates an equivalent circuit for the negative clamp of FIG. 8A.

Referring now to FIG. 8B, an equivalent circuit for the negative clamp circuit 258 is illustrated at 500. When a load is connected in a high-side configuration and the module 10 is disconnected from the voltage source, the negative clamp provides a recirculation path illustrated at 502 for dissipating inductive energy stored in the load 504. The equivalent circuit includes a first diode 506, a switch for transistor 508 having a collector connected to a cathode of the diode 506, and to a cathode of a 45 volt zener diode 510. A cathode of the zener diode 510 is connected to a base 512 of the transistor 508. The resistor 470 is connected to the anode of the zener diode 510 and to ground. The emitter of the transistor 508 is connected to ground.

Figure 9A:
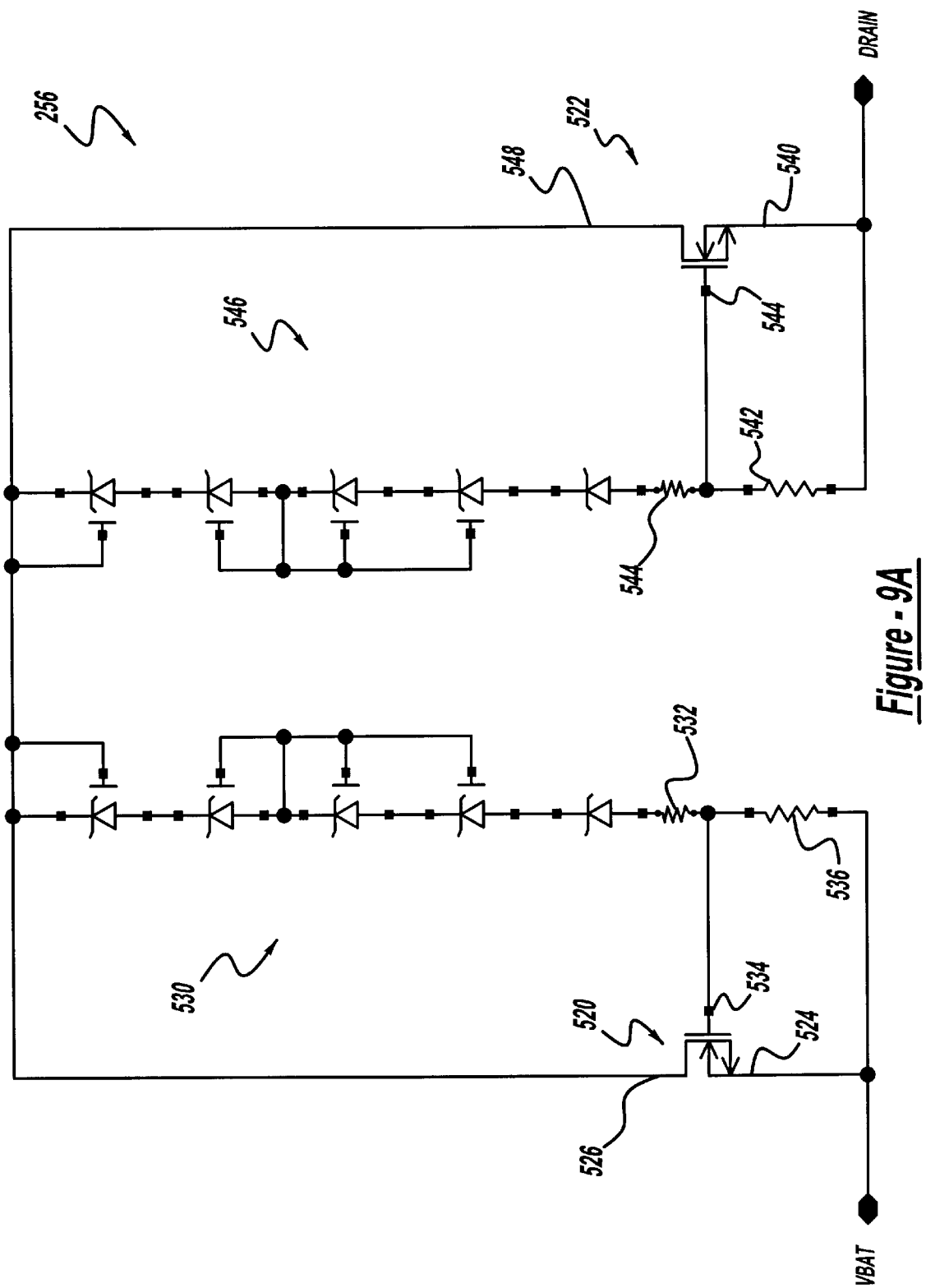
FIG. 9A the positive clamp circuit of FIG. 5 in further detail.

Referring now to FIG. 9A, the positive clamp circuit 256 is illustrated in further detail. The positive clamp circuit 256 acts as a secondary positive clamp during fault modes of operation. The positive clamp circuit 256 includes first and second LDMOSFET transistors 520 and 522. A source of the first transistor 520 is connected to VBAT. A drain 526 of the transistor 520 is connected to a cathode of a plurality of series-connected zener diodes 530. An anode of the series-connected zener diodes 530 is connected to one end of a resistor 532. An opposite end of the resistor 532 is connected to a gate 534 of the transistor 520. A resistor 536 has one end connected to the gate 534 and an opposite end connected to the source 524.

The source 540 of the second transistor 522 is connected to the drain of the power transistor and to one end of a resistor 542. An opposite end of the resistor 542 is connected to a gate 544 of the transistor 522 and to a resistor 544. An opposite end of the resistor 544 is connected to an anode of a plurality of series-connected zener diodes 546. A cathode of the zener diodes 546 is connected to a drain 548 of the transistor 522, to the drain 526 of the transistor 520 and to the cathode of the zener diodes 530.

Figure 9B:
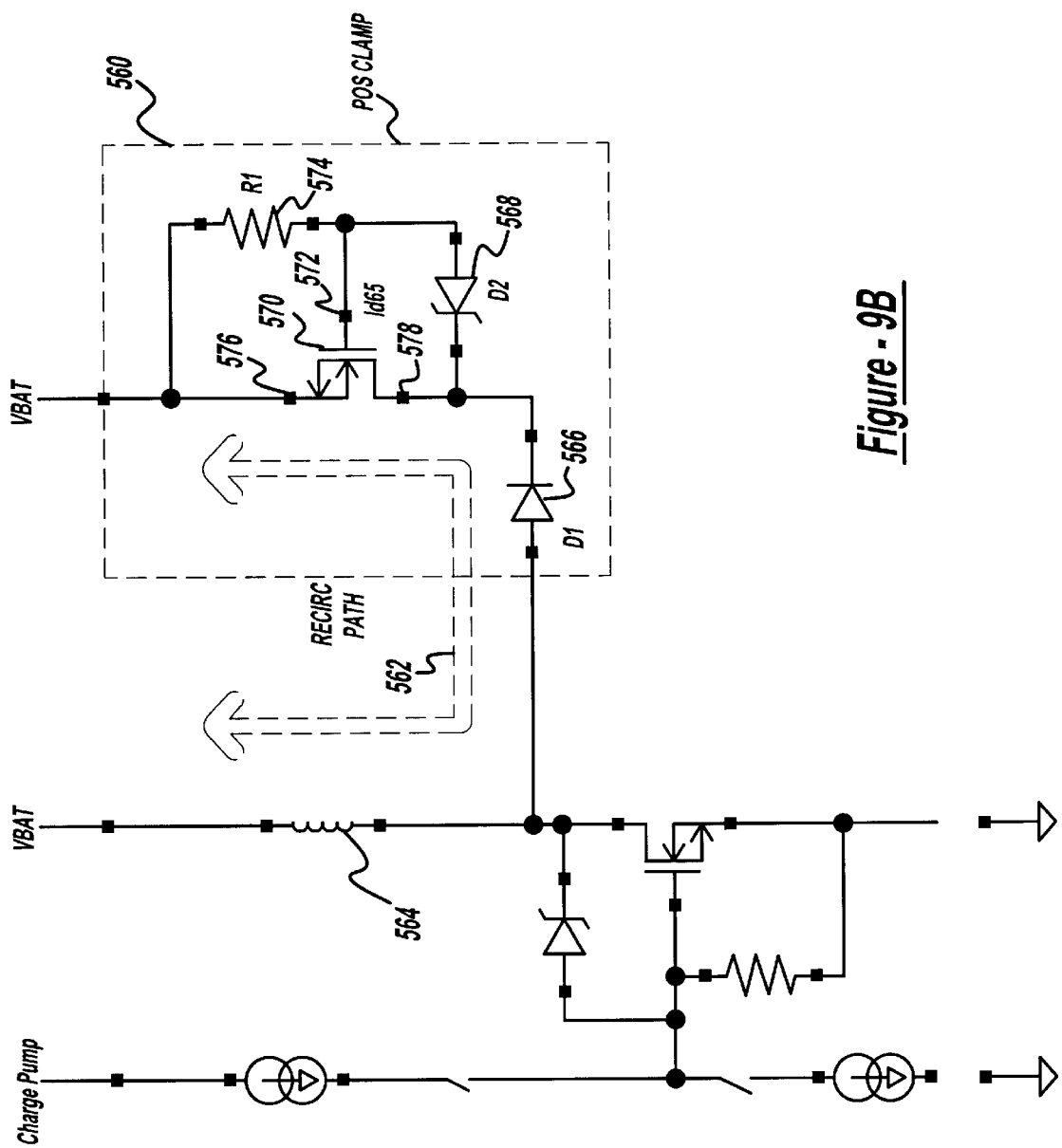
FIG. 9B illustrates an equivalent circuit for the positive clamp of FIG. 9A.

Referring now to FIG. 9B, an equivalent circuit for the positive clamp 256 is illustrated at 560. The positive clamp 560 provides a recirculation path 562 for inductive energy stored on a low-side configuration driver load 564. For purposes of simplicity, only half of the positive clamp 256 is illustrated. The equivalent circuit 560 includes a diode 566 having an anode connected to the drain of the main power transistor. A cathode of the diode 566 is connected to a cathode of a zener diode 568 and to a drain of a transistor 570. An anode of the zener diode 568 is connected to a gate 572 of the transistor 570 and to a resistor 574. And opposite end of the resistor 574 is connected to VBAT and to a source 576 of the transistor 570. A drain 578 of the transistor 570 is connected to the cathode of the diode 566 and to the cathode of the zener diode 568.

The high-side, low-side driver according to the invention addresses the detection of open and shorted loads, thermal protection of the power transistor, loss of module ground, reverse battery protection, and supply interruption during energized loads. The high-side, low-side driver according to the invention can be packaged in an integrated circuit without the need for external components which diminish the reliability of the system, add to the overall cost, and increase the overall size of the system.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A driver for controlling current conducted in an inductive load and having a high-side configuration and a flow-side configuration, comprising:
    a power transistor having a gate, a source and a drain;
    a gate drive circuit coupled to the gate for turning the power transistor on and off;
    a positive clamp circuit coupled between the drain of the power transistor and a first power conductor that provides a recirculation path for inductive energy stored in the inductive load when the driver is in the low-side configuration, wherein the positive clamp circuit comprises:
        a first transistor;
        a zener diode having an anode coupled to a control terminal of the first transistor and a cathode coupled to a first current carrying terminal of the first transistor; and
        a resistor coupled between the control terminal of the first transistor and a second current carrying terminal of the first transistor; and
    a negative clamp circuit coupled between the source of the power transistor and a second power conductor that provides a recirculation path for inductive energy stored in the inductive load when the driver is in the high-side configuration.

2. The driver of claim 1 wherein the positive clamp circuit further comprises a diode having a cathode coupled to the first current carrying terminal of the first transistor and an anode coupled to the drain of the power transistor.

3. A driver for controlling current conducted in an inductive load, comprising:
    a power transistor having a gate, a source and a drain;
    a gate drive circuit coupled to the gate for turning the power transistor on and off;
    a thermal shutdown circuit coupled to the gate drive circuit that turns off the power transistor when the driver reaches an operating temperature above approximately 150 degrees Celsius;
    a positive clamp circuit that couples the drain of the power transistor to a first power conductor; and
    a negative clamp circuit that couples the source of the power transistor to a second power conductor.

* * * * *